United States Patent [19]
Hong

[11] Patent Number: 5,734,553
[45] Date of Patent: Mar. 31, 1998

[54] FAN/PINS SEAT ASSEMBLY FOR AN INTERGRATED CIRCUIT

[76] Inventor: Chen Fu-in Hong, No. 3, Lane 45, Yi-Yung Road, Kaohsiung, Taiwan

[21] Appl. No.: 636,397

[22] Filed: Apr. 23, 1996

[51] Int. Cl.$^6$ ........................................ H05K 7/20
[52] U.S. Cl. ............... 361/697; 415/178; 257/722
[58] Field of Search ............... 454/184; 361/694, 361/695, 697, 687, 703; 312/236; 165/121–126, 80.3; 310/68 C, 68 D; 257/722; 174/16.1, 16.3; 416/223 R; 415/115, 177, 178, 208.3, 213.1, 214.1

[56] References Cited

U.S. PATENT DOCUMENTS

| | | | |
|---|---|---|---|
| 5,287,249 | 2/1994 | Chen | 361/718 |
| 5,335,722 | 8/1994 | Wu | 165/122 |
| 5,377,745 | 1/1995 | Hsieh | 165/80.3 |
| 5,421,402 | 6/1995 | Lin | 361/697 |
| 5,436,798 | 7/1995 | Wieland, Jr. | 361/710 |
| 5,522,700 | 6/1996 | Hong | 415/177 |
| 5,559,674 | 9/1996 | Katsui | 361/697 |
| 5,582,506 | 12/1996 | Hong | 361/697 |

*Primary Examiner*—Gerald P. Tolin
*Attorney, Agent, or Firm*—Bacon & Thomas

[57] ABSTRACT

A fan/pins seat assembly includes a pins seat, an integrated circuit mounted on the pins seat, a finned plate mounted to an upper surface of the integrated circuit and including a plurality fins extending upwardly from an upper side thereof, and a board member mounted to the finned plate and having a fan mounted thereon. The pins seat includes a first engaging member provided thereon, and the board member includes a second engaging member formed thereon for releasably engaging with the first engaging member.

7 Claims, 6 Drawing Sheets

5,734,553

FAN/PINS SEAT ASSEMBLY FOR AN INTERGRATED CIRCUIT

BACKGROUND OF THE INVENTION

1. Field of the Invention

The present invention relates to a fan/pins seat assembly for an integrated circuit and, more particularly, to a fan device which directly engages with a pins seat on which the integrated circuit is mounted, thereby securely holding the integrated circuit therebetween.

2. Description of the Related Art

Heat transfer is an important factor to performance of integrated circuits. A wide variety of cooling devices have heretofore been provided, for example, U.S. Pat. No. 5,335,722 to Wu, issued on Aug. 9, 1994 and U.S. Pat. No. 5,287,249 to Chen, issued on Feb. 15, 1994, and Applicant's U.S. patent application Ser. No. 08/399,041 filed on Mar. 6, 1995, all of which disclose fan devices for dissipating heat generated by integrated circuits. However, all of these prior art fan devices engage with the integrated circuits which have to be mounted on pins seats of printed circuit boards by an additional means (generally including a rod and an eccentric plate) so as to securely mount the integrated circuits to the pins seats, resulting in an increase in the cost. The present invention is intended to provide an improved design to mitigate and/or obviate the above problems.

SUMMARY OF THE INVENTION

It is a primary object of the present invention to a provide a fan/pins seat assembly in which a fan device directly engages with a pins seat on which an integrated circuit is mounted, thereby securely holding the integrated circuit therebetween and eliminating the additional means required in prior art designs.

A fan/pins seat assembly in accordance with the present invention includes a pins seat having a first engaging means provided thereon, an integrated circuit mounted on the pins seat, a finned plate mounted to an upper surface of the integrated circuit and including a plurality fins extending upwardly from an upper side thereof, and a board member mounted above the finned plate and having a fan mounted thereon and including a second engaging means formed thereon for releasably engaging with the first engaging means on the pins seat, thereby securely holding the integrated circuit between the finned plate and the pins seat.

In a first embodiment of the invention, the first engaging means includes a pair of spaced bores defined in the pins seat, while the second engaging means includes a pair of spaced resilient tongues extending downwardly from a bottom side of the board member and extending through the bores. Each tongue has an enlarged snapping head extending beyond the associated bore and having a diameter greater than that of the through hole and a slit defined in a longitudinal direction thereof and separating the snapping head into two half pieces.

In a preferred embodiment of the invention, the first engaging means includes a pair of spaced bores defined in the pins seat, while the second engaging means includes a pair of spaced resilient tongues extending downwardly from a bottom side of the board member and extending through the bores. Each tongue has an enlarged snapping head having a diameter greater than that of the associated bore and a slit defined in a longitudinal direction thereof and separating the snapping head into two half pieces. Each bore includes a counterbore defined in an end thereof adjacent to the bottom side of the pins seat, such that the associated snapping head is received in the counterbore.

In an alternative embodiment, a peripheral wall defining each bore includes a plurality of flanges projecting outwardly therefrom, thereby allowing the snapping heads to be selectively engaged with one of the flanges.

In a second embodiment of the invention, the second engaging means includes a pair of spaced guiding rods extending downwardly from a bottom side of the board member and a pair of resilient snapping members respectively provided on both sides of each of the guiding rods. Each resilient snapping member projects downwardly from the bottom side of the board member and has a distal hooked end for releasably engaging with the bottom side of the pins seat. The first engaging means includes a pair of spaced bores defined in the pins seat through which the guiding rods extend.

Preferably, the first engaging means may further include a pair of recesses defined in each of two opposite sides of the pins seat, each of the pair of recesses being respectively located at both sides of the associated bore of the pins seat. Each recess may extend in the bottom side of the pins seat for a distance and is dimensioned and sized to fittingly receive the distal hooked end of the associated snapping member.

Preferably, the finned plate includes a space defined in a center of the upper side thereof, and the board member includes a first hole defined in a mediate portion thereof, a support member provided under the hole, and a plurality of ribs extending downwardly from a periphery defining the hole to the support member, the support member including a stud formed on an upper side thereof and having a second hole defined therein for rotatably receiving a rotor shaft of the fan. By such an arrangement, the fan is received in an area defined by the space, thereby minimizing an overall thickness of the fan/pins seat assembly.

Other objects, advantages, and novel features of the invention will become more apparent from the following detailed description when taken in conjunction with the accompanying drawings.

DESCRIPTION OF THE PREFERRED EMBODIMENTS

Figure 1:
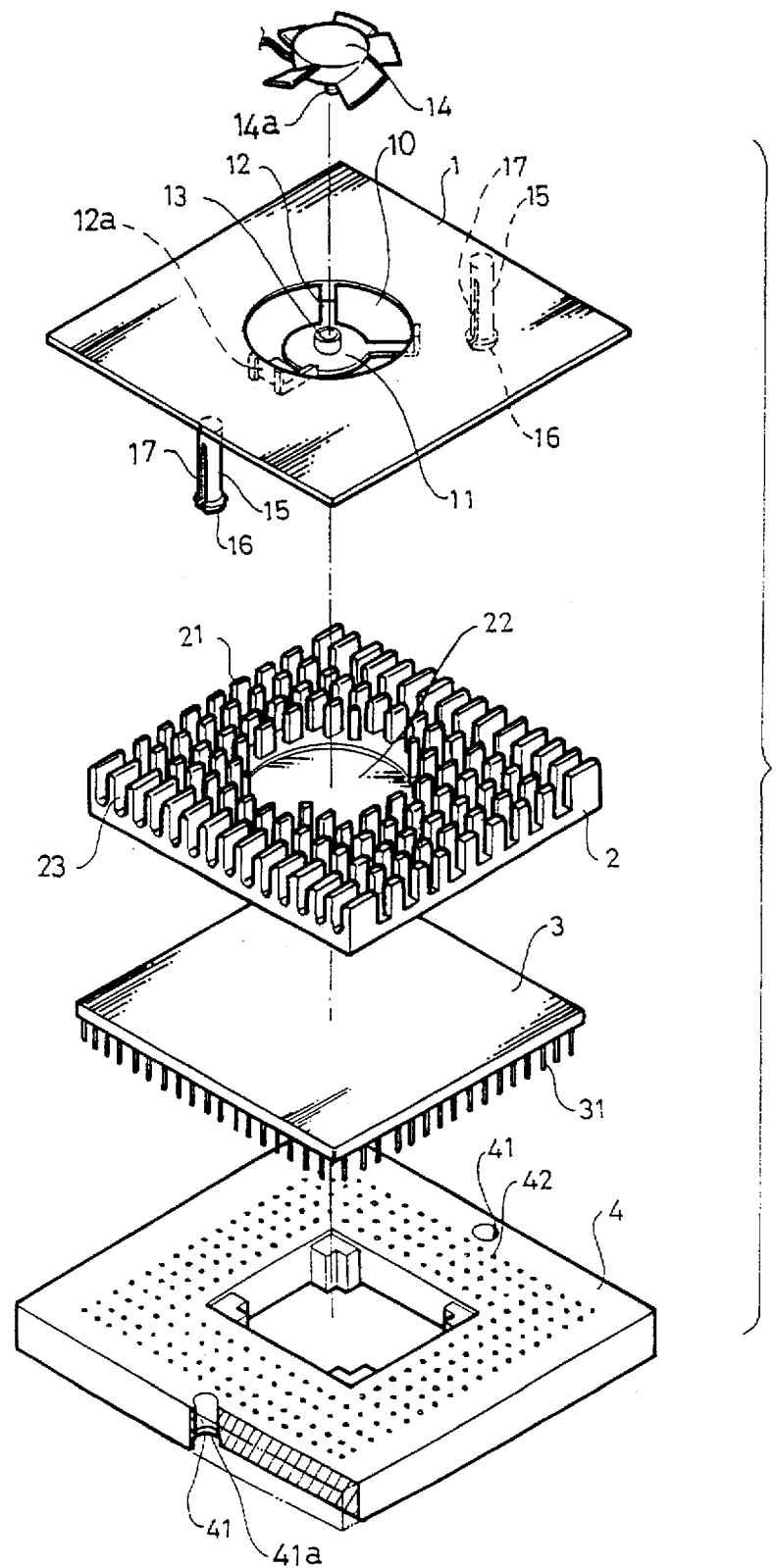
FIG. 1 is an exploded perspective view of a first embodiment of a fan/pins seat assembly for an integrated circuit in accordance with the present invention.
Figure 2:
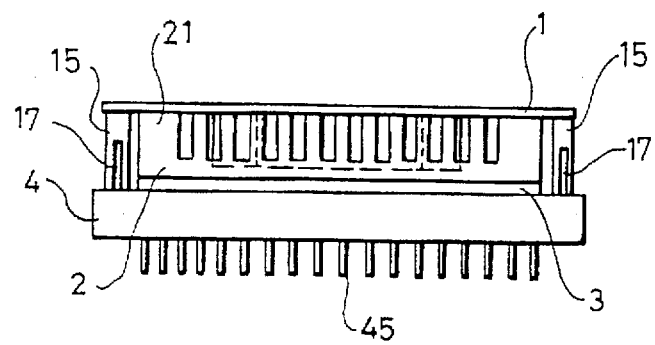
FIG. 2 is a side elevational view of the assembled fan/pins seat assembly in FIG. 1.
Figure 3:
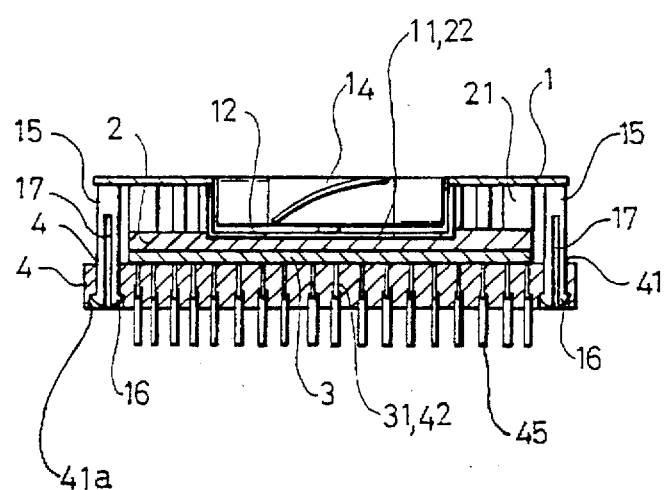
FIG. 3 is a cross-sectional view of the assembled fan/pins seat assembly.

Referring to the drawings and initially to FIGS. 1 to 3, a first embodiment of a fan/pins seat assembly for an integrated circuit in accordance with the present invention generally includes a finned plate 2, a board member 1 having a fan 14 mounted thereon, an integrated circuit 3 (e.g., a central processing unit), and a pins seat 4 which is to be securely mounted to a printed circuit board (not shown). The finned plate 2 includes a plurality of rows and columns of fins 21 extending from an upper side thereof and a space 22 defined in a center of the upper side, each two fins 21 being separated by a gap 23 for air circulation purpose. The finned plate 2 is made of materials having excellent heat dissipation characteristics, such as aluminum. Preferably, the fins 21 are integral with the finned plate 2 and made of the same material.

The board member 1 includes a hole 10 defined in a mediate portion thereof and a support member 11 is provided under the hole 10 and connected to a periphery defining the hole 10 by a plurality of ribs 12. Each rib 12 extends downwardly from the periphery defining the hole 10 to the support member 11, and one of the ribs 12 has a groove 12a (see FIG. 1) through which electric wires (not labeled) of the fan 14 extend as so to electrically connect a power source (not shown). A stud 13 is formed on an upper side of the support member 11 and includes a hole (not labeled) defined therein for rotatably receiving a rotor shaft 14a of the fan 1. Nevertheless, it is appreciated that other types of arrangements for rotatably mounting the fan 14 to the board member 1 can be used.

The pins seat 4 includes a first engaging means provided thereon for releasably engaging with a second engaging means formed on a bottom side of the board member 1. In this embodiment, the first engaging means includes a pair of spaced bores 41 defined in the pins seat 4, while the second engaging means includes a pair of spaced tongues 15 extending downwardly from the lower side of the board member 1. Each tongue 15 has an enlarged snapping head 16 extending beyond the associated bore 41 and having a diameter greater than that of the associated bore 41 and a slit 17 defined in a longitudinal direction of the tongue 15 and separating the snapping head 16 into two half pieces. The tongue 15 is made of resilient material, thereby allowing the two half pieces to move toward each other when passing through the associated bore 41 of the pins seat 4 and then expanding to their initial separated position to prevent disengagement therefrom. The pins seat 4 includes a plurality of pin holes 42 for receiving pins 31 on the integrated circuit 3 and a plurality of pins 45 so as to be mounted to a printed circuit board (not shown), which is conventional and therefore no further description is required.

In assembly, as shown in FIGS. 2 and 3, the integrated circuit 3 is firstly mounted to the pins seat 4 by means of inserting the pins 31 into the corresponding pin holes 42. The finned plate 2 is then placed onto the upper side of the integrated circuit 3. Thereafter, the board member 1, after the fan 14 is mounted thereon, is mounted to a top of the finned plate 2, with the tongues 15 extending through the bores 41, in which the enlarged snapping heads 16, after passing through the bores 41 (i.e., reaching a bottom side of the pins seat 4), expand to their separated positions, thereby securely holding the integrated circuit 3 between the finned plate 2 and the pins seat 4 and preventing disengagement therefrom. It is appreciated that the finned plate 2 has a width smaller than a distance between the tongues 15. Alternatively, the finned plate 2 includes through holes (not shown) to allow the tongues 15 to extend therethrough. It is further appreciated that the fan 14 is mounted in an area defined by the space 22 (see FIG. 3), thereby minimizing an overall thickness of the whole assembly. Operation of the fan device for heat dissipation purpose is conventional and therefore is not described.

Figure 3A:
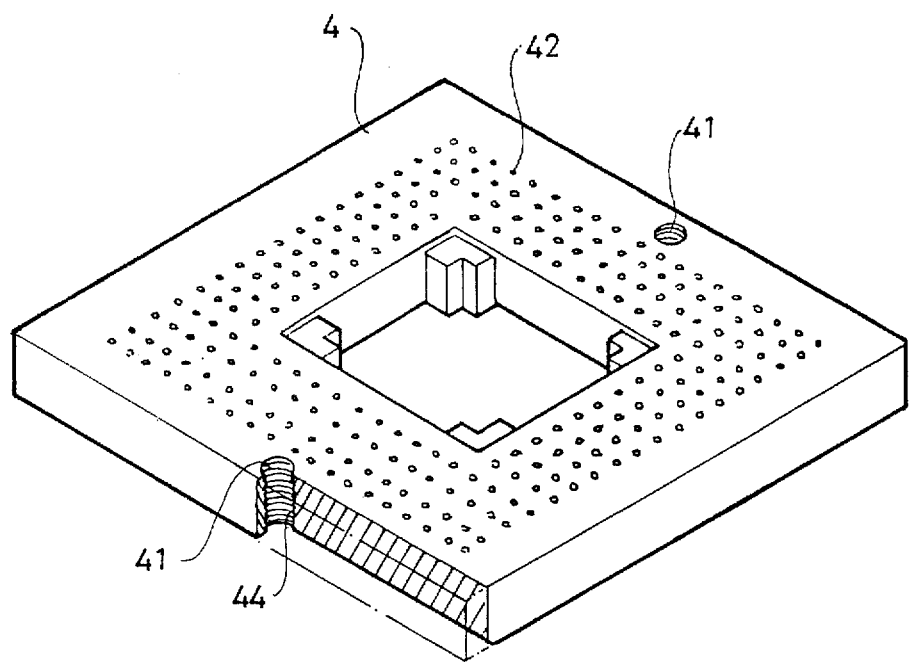
FIG. 3A is a perspective view, partly cutaway, illustrating another embodiment of the pins seat.
Figure 4:
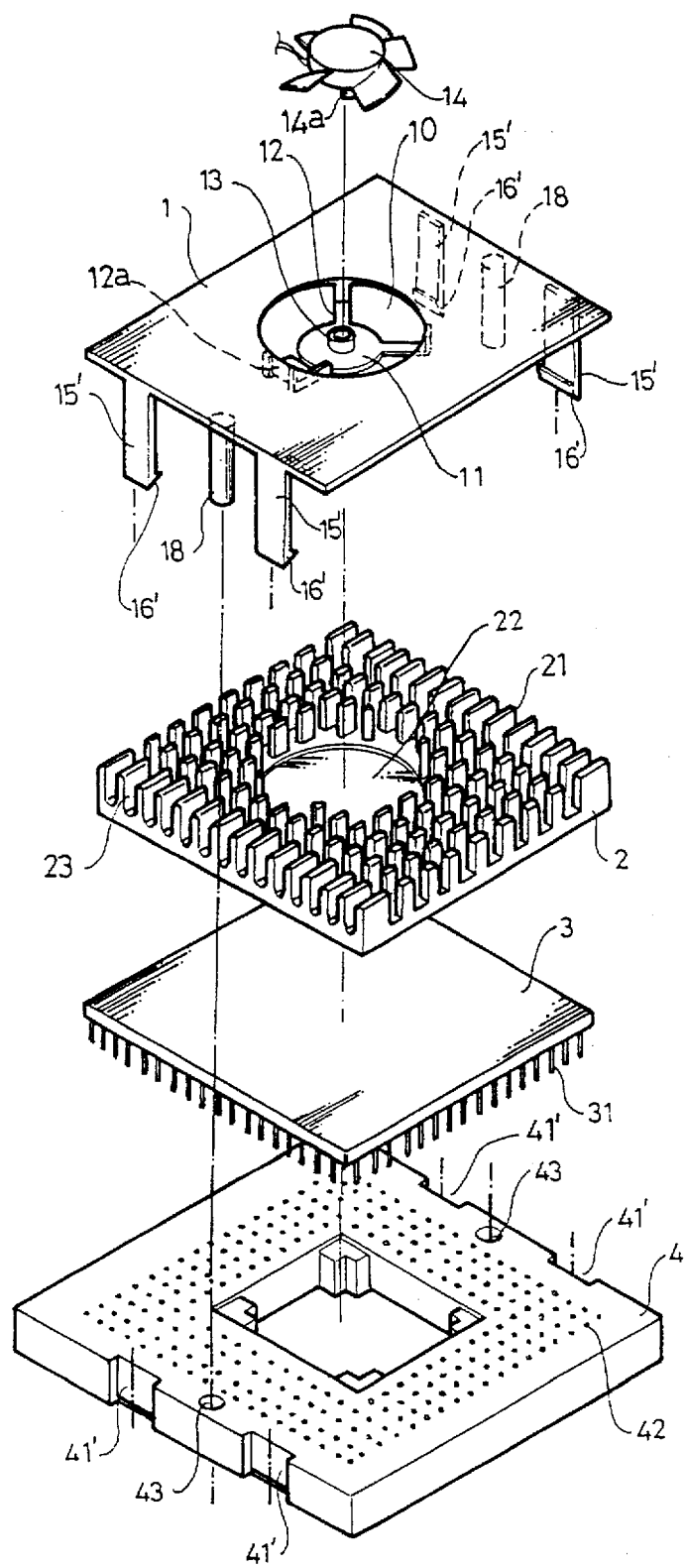
FIG. 4 is an exploded perspective view of a second embodiment of a fan/pins seat assembly for an integrated circuit in accordance with the present invention.
Figure 5:
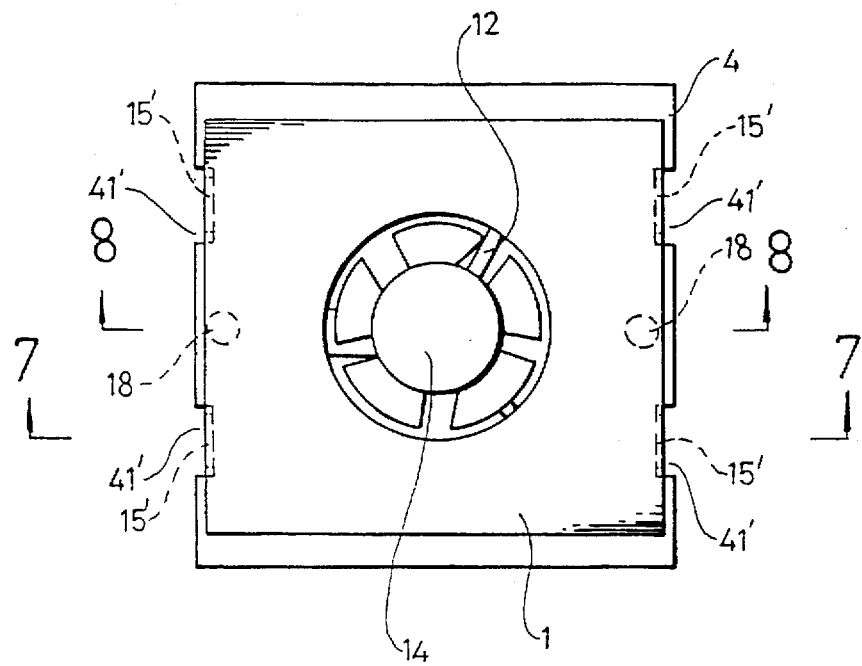
FIG. 5 is a top plan view of the assembled fan/pins seat assembly in FIG. 4.
Figure 6:
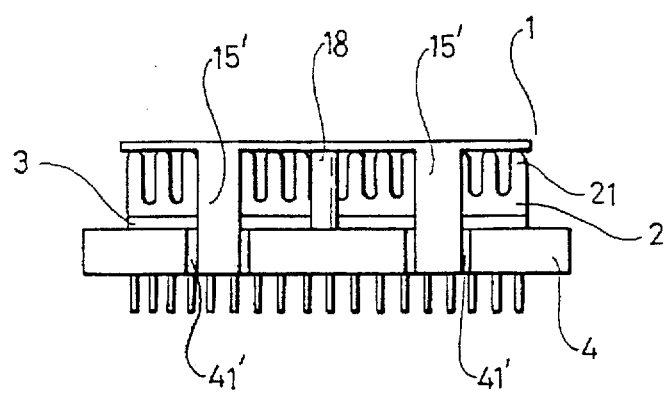
FIG. 6 is a left side elevational view of he assembled fan/pins seat assembly in FIG. 4.

Referring to FIG. 3, preferably, each bore 41 includes a counterbore 41a which is defined in an end adjacent to the bottom side of the pins seat 4, such that the associated snapping head 16 is received in the counterbore 41 instead of extending beyond the bore 41. In an alternative embodiment, as shown in FIG. 3A, a peripheral wall defining each bore 41 includes a plurality of flanges 44 projecting outwardly therefrom, thereby allowing the snapping heads 16 to be selectively engaged with one of the flanges, i.e., the snapping effect can be adjusted by means of selectively engaging the snapping heads 16 with the flanges.

FIGS. 4 through 8 illustrate a second embodiment of a fan/pins seat assembly in accordance with the present invention in which like elements are designated by like reference numerals. The fan/pins seat assembly of the second embodiment is substantially the same as that of the first embodiment, except for the arrangement in the first and second engaging means.

Figure 7:
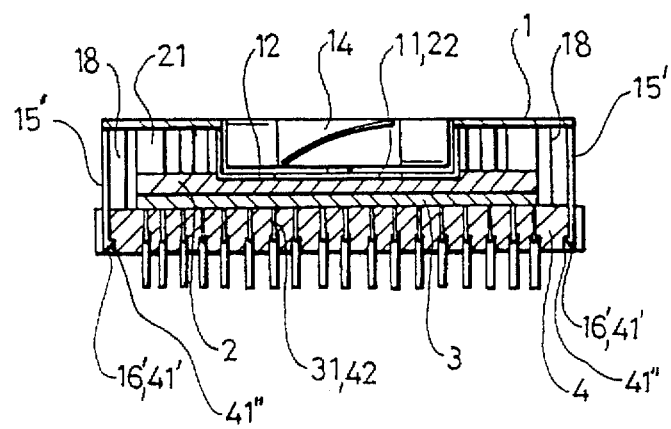
FIG. 7 is a cross-sectional view taken along line 7—7 in FIG. 5.
Figure 8:
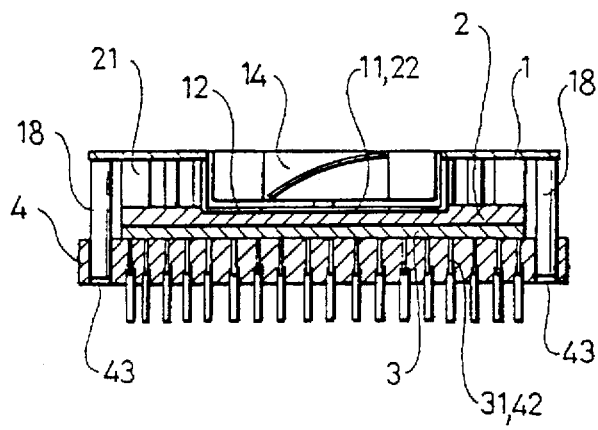
FIG. 8 is a cross-sectional view taken along line 8—8 in FIG. 5.

In this embodiment, the second engaging means includes a pair of spaced guiding rods 18 extending downwardly from a bottom side of the board member 1 and a pair of resilient snapping members 15' respectively provided on both sides of each guiding rod 18, each resilient snapping member 15' projecting downwardly from the bottom side of the board member 1 and having a distal hooked end 16'. The first engaging means includes a pair of spaced bores 43 defined in the pins seat 4 through which the guiding rods 18 extend and a pair of recesses 41' defined in each of two opposite sides of the pins seat 4, each of the pair of recesses 41' being respectively located at both sides of the associated bore 43. Each snapping member 15' extends through the associated recess 41' with the hooked end 16' thereof releasably engaging with a bottom side of the pins seat 4, thereby securely holding the integrated circuit 3 between the finned plate 2 and the pins seat 4. Preferably, as shown in FIG. 7, each recess 41" extends in the bottom side of the pins seat 4 for a distance and is dimensioned and sized to fittingly receive the distal hooked ends 16'.

According to the above description, it is appreciated that, the integrated circuit 3 is securely held between the finned plate 2 and the pins seat 4 in which the additional means for securely mounting the integrated circuit 3 to the pins seat 4 required in prior art is eliminated. In addition, the assembling procedure is very simple and the assembled device has a relatively small overall thickness with a reliable positioning effect.

Although the invention has been explained in relation to its preferred embodiment, it is to be understood that many other possible modifications and variations can be made without departing from the spirit and scope of the invention as hereinafter claimed.

What is claimed is:

1. A fan/pins seat assembly for an integrated circuit comprising:

a pins seat having a first engaging means provided thereon, the first engaging means including a pair of spaced bores defined in the pins seat;

an integrated circuit mounted on the pins seat and having an upper surface;

a finned plate mounted to the upper surface of the integrated circuit and including a plurality fins extending upwardly from an upper side thereof; and a board member securely mounted above the finned plate and having a fan mounted thereon, the board member further comprising a second engaging means formed thereon the second engaging means including a pair of spaced resilient tongues extending downwardly from a bottom side of the board member and extending through the bores of the first engaging means, each of the tongues having an enlarged snapping head having a diameter greater than that of the bores and a slit defined in a longitudinal direction thereof and separating the snapping head into two half pieces for releasably engaging with the first engaging means on the pins seat, thereby securely holding the integrated circuit between the finned plate and the pins seat, each of the bores including a counterbore defined in an end thereof adjacent to the bottom side of the pins seat, such that the associated snapping head is received in the counterbore.

2. The fan/pins seat assembly as claimed in claim 1 wherein a peripheral wall defining each of the bores includes a plurality of flanges projecting outwardly therefrom into the bores.

3. The fan/pins seat assembly as claimed in claim 1, wherein the fan has a rotor shaft, the finned plate includes a space defined in a center of the upper side thereof, and the board member includes a hole defined in a mediate portion thereof, a support member provided under the hole, and a plurality of ribs extending downwardly from a periphery defining the hole to the support member, the support member including a stud formed on an upper side thereof and having a second hole defined therein for rotatably receiving the rotor shaft of the fan.

4. A fan/pins seat assembly for an integrated circuit comprising;

a pins seat having a first engaging means provided thereon;

an integrated circuit mounted on the pins seat and having an upper surface;

a finned plate mounted to the upper surface of the integrated circuit and including a plurality of fins extending upwardly from an upper side thereof; and a board member securely mounted above the finned plate and having a fan mounted thereon, the board member further comprising a second engaging means formed thereon, the second engaging means including a pair of spaced guiding rods extending downwardly from a bottom side of the board member and a pair of resilient snapping members respectively provided on both sides of each of the guiding rods, each of the resilient snapping members projecting downwardly from the bottom side of the board member and having a distal hooked end for releasably engaging with the bottom side of the pins seat and the first engaging means including a pair of spaced bores defined in the pins seat through which the guiding rods extend.

5. The fan/pins seat assembly as claimed in claim 4, wherein the first engaging means further includes a pair of recesses defined in each of two opposite sides of the pins seat, each of the pair of recesses being respectively located at both sides of the associated bore.

6. The fan/pins seat assembly as claimed in claim 5, wherein each of the recesses extends in the bottom side of the pins seat for a distance and is dimensioned and sized to fittingly receive the associated distal hooked end.

7. The fan/pins seat assembly as claimed in claim 4, wherein the fan has a rotor shaft, the finned plate includes a space defined in a center of the upper side thereof, and the board member includes a hole defined in a mediate portion thereof, a support member provided under the hole, and a plurality of ribs extending downwardly from a periphery defining the hole to the support member, the support member including a stud formed on an upper side thereof and having a second hole defined therein for rotatably receiving the rotor shaft of the fan.

* * * * *